(12) United States Patent
Huang

(10) Patent No.: US 9,735,680 B2
(45) Date of Patent: Aug. 15, 2017

(54) CONSTANT ON-TIME PULSE WIDTH CONTROL-BASED SCHEME INCLUDING CAPABILITIES OF FAST TRANSIENT RESPONSE AND ADAPTIVELY ADJUSTING ON-TIME PULSE WIDTH

(71) Applicant: MEDIATEK INC., Hsin-Chu (TW)

(72) Inventor: Hua-Chiang Huang, Taoyuan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/009,806

(22) Filed: Jan. 28, 2016

(65) Prior Publication Data

US 2017/0025952 A1    Jan. 26, 2017

Related U.S. Application Data

(60) Provisional application No. 62/195,927, filed on Jul. 23, 2015.

(51) Int. Cl.
  *H02M 3/158* (2006.01)
  *H02M 3/156* (2006.01)
  *G01R 19/165* (2006.01)
  *H02M 1/00* (2006.01)

(52) U.S. Cl.
  CPC ...... *H02M 3/158* (2013.01); *G01R 19/16585* (2013.01); *H02M 3/156* (2013.01); *H02M 2001/0025* (2013.01); *H02M 2001/0045* (2013.01); *H02M 2001/0067* (2013.01); *H02M 2003/1566* (2013.01)

(58) Field of Classification Search
  CPC .. H02M 3/158; H02M 3/1588; H02M 3/1582; H02M 2001/0045; H02M 2001/0067
  See application file for complete search history.

(56) References Cited

U.S. PATENT DOCUMENTS

| | | | |
|---|---|---|---|
| 7,834,606 B2 | 11/2010 | Liu | |
| 8,928,303 B2 | 1/2015 | Zhu | |
| 2010/0033215 A1* | 2/2010 | Fogg | H03K 4/50 327/137 |
| 2012/0032660 A1 | 2/2012 | Nakamura | |
| 2012/0306586 A1 | 12/2012 | Wan | |
| 2014/0340059 A1* | 11/2014 | Chen | H02M 3/156 323/271 |
| 2015/0077080 A1* | 3/2015 | Chen | H02M 3/156 323/282 |

(Continued)

*Primary Examiner* — Gary L Laxton
*Assistant Examiner* — Lakaisha Jackson
(74) *Attorney, Agent, or Firm* — Winston Hsu

(57) ABSTRACT

A constant on-time pulse width control-based apparatus capable of detecting a transient event of a voltage converter includes a specific comparator, a logic circuit, and a controller. The specific comparator generates a logic control signal to the logic circuit according to two resultant signals of the controller. The logic circuit generates a pulse control signal with an on-time pulse width to charge an output capacitor according to the logic control signal. The controller generates the two resultant signals to the specific comparator by generating a voltage ramp signal and amplifying an output voltage ripple signal based on a reference voltage, and detects the transient event to dynamically adjust the on-time pulse width of the pulse control signal according to the amplified output voltage ripple signal.

8 Claims, 13 Drawing Sheets

(56) References Cited

U.S. PATENT DOCUMENTS

2015/0244262 A1* 8/2015 Ouyang ............... H02M 3/158
                                                  323/283
2016/0013778 A1* 1/2016 Li ........................ H03K 7/08
                                                  323/288

* cited by examiner

CONSTANT ON-TIME PULSE WIDTH CONTROL-BASED SCHEME INCLUDING CAPABILITIES OF FAST TRANSIENT RESPONSE AND ADAPTIVELY ADJUSTING ON-TIME PULSE WIDTH

CROSS REFERENCE TO RELATED APPLICATION

This application claims priority of U.S. provisional application Ser. No. 62/195,927 filed on Jul. 23, 2015, which is entirely incorporated herein by reference.

BACKGROUND

The present invention relates to a voltage converter scheme, and more particularly to a constant on-time pulse width control-based apparatus used in a voltage converter and including fast transient response capability and flexibility for adaptively adjusting the on-time pulse width in response to the occurrence of a transient event.

Generally speaking, a conventional constant on-time controller is usually limited by small ESR (equivalent series resistor) of its output capacitor. The conventional controller cannot effectively reflect/detect output voltage ripple to detect or response to the occurrence of a transient event due to that the ESR is too small. Some conventional schemes are proposed to improve this problem. However, a part of these conventional schemes still cannot effectively detect or response to the occurrence of the transient event. In addition, another part of the conventional schemes may adopt a certain fixed value to set the on-time pulse width. However, it is not flexible to adopt the fixed value to set the on-time pulse width since the event of transient variation is not always the same.

SUMMARY

Therefore one of the objectives of the present invention is to provide a constant on-time pulse width control-based apparatus capable of detecting a transient event of a voltage converter, including fast transient response capability, and including the flexibility for adaptively adjusting the on-time pulse width in response to the occurrence of the transient event.

According to embodiments of the present invention, a constant on-time pulse width control-based apparatus capable of detecting a transient event of a voltage converter is disclosed. The apparatus comprises a specific comparator, a logic circuit, and a controller. The specific comparator is configured for generating a logic control signal to the logic circuit according to two resultant signals of the controller. The logic circuit is coupled to the specific comparator and configured for generating a pulse control signal with an on-time pulse width to charge an output capacitor of an output stage circuit of the voltage converter according to the logic control signal. The controller is coupled to the specific comparator and the logic circuit and configured for generating the two resultant signals to the specific comparator by generating a voltage ramp signal and amplifying an output voltage ripple signal based on a reference voltage, and configured for detecting the transient event to dynamically adjust the on-time pulse width of the pulse control signal according to the amplified output voltage ripple signal.

According to the embodiments, a constant on-time pulse width control-based method capable of detecting a transient event of a voltage converter is disclosed. The method comprises: using a specific comparator to generate a logic control signal to a logic circuit according to two resultant signals; generating a pulse control signal with an on-time pulse width to charge an output capacitor of the voltage converter according to the logic control signal; generating the two resultant signals to the specific comparator by generating a voltage ramp signal and amplifying an output voltage ripple signal based on a reference voltage; and detecting the transient event and adaptively adjusting the on-time pulse width of the pulse control signal according to the amplified output voltage ripple signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
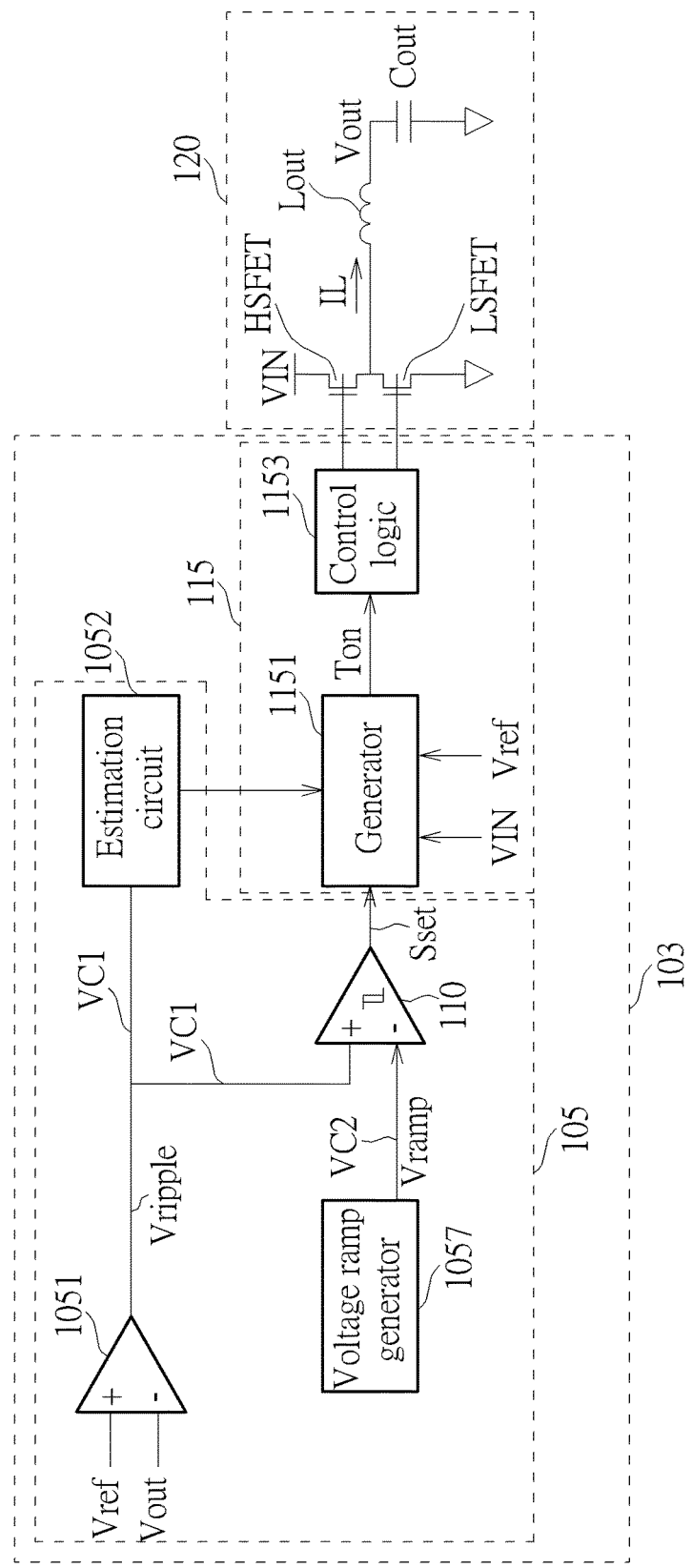
FIG. 1 is a diagram of a voltage converter according to embodiments of the present invention.

Please refer to FIG. 1, which is a diagram of a voltage converter 100 according to embodiments of the present invention. The voltage converter 100 in this embodiment is a DC-to-Dc buck converter (but not limited) and comprises an apparatus 103 and an output stage circuit 120 wherein the apparatus 103 comprises a controller 105, a comparator 110, and a logic circuit 115. The controller 105 comprises an error amplifier 1051, a voltage ramp generator 1057, and an estimation circuit 1052. The logic circuit 115 comprises a generator 1151 and control logic 1153. The output stage circuit 120 comprises two switching transistors HSFET & LSFET, an output inductor Lout, and an output capacitor Cout. The DC-to-DC buck converter 100 is arranged for receiving an input DC voltage VIN to generate and output an output voltage signal Vout including DC output voltage wherein voltage ripple(s) may occur on the output voltage signal Vout due to equivalent series resistor of output capacitor Cout. The apparatus 103 generates a pulse control signal Ton to control ON/OFF statuses of the switching transistors HSFET & LSFET to dynamically charge the capacitor Cout during an on-time pulse width of pulse control signal Ton, and controls the capacitor Cout to be discharged during an off-time pulse width of signal Ton. The apparatus 103 includes a constant on-time pulse width control-based operation and can be regarded as a constant on-time pulse width control-based controller. The constant on-time pulse width control-based operation means that the apparatus 103 is arranged to adopt a fixed/constant on-time pulse width during each cycle to control the ON/OFF statuses of the switching transistors HSFET & LSFET in a normal loading condition; the on-time pulse width is adaptively extended or decreased/shortened by the apparatus 103 if the loading condition is changed (i.e. a transient event occurs).

A conventional constant on-time controller may be limited by small ESR (equivalent series resistor) of an output capacitor; the conventional controller cannot effectively reflect/detect output voltage ripple due to that the ESR is too small. This causes that the variation of output voltage ripple of the conventional constant on-time controller is too small to detect the occurrence of a transient event. In addition, it is not flexible for the conventional constant on-time controller to extend the on-time pulse width to a certain fixed value even though the conventional controller detects the transient event. In the embodiment, the controller 105 combined with comparator 110 and logic circuit 115 is employed to effectively detect the occurrence of a transient event and enhance the transient response by adaptively adjusting the on-time pulse width rather than using the certain fixed value, so as to solve the problem.

The controller 105 is configured for generating the two resultant signals VC1 and VC2 to the comparator 110 by generating a voltage ramp signal Vramp and generating and amplifying an output voltage ripple signal Vripple based on a reference voltage Vref and output voltage signal Vout, and configured for detecting the transient event to dynamically adjust the on-time pulse width of the pulse control signal Ton according to the amplified output voltage ripple signal Vripple. In the embodiment, the amplified output voltage ripple signal Vripple and the voltage ramp signal Vramp are respectively used as the resultant signals VC1 and VC2. However, this is not intended to be a limitation of the present invention; in other embodiment, the resultant signals VC1 and VC2 can be generated by further processing the signals Vripple and Vramp. The comparator 110 is configured for generating a logic control signal Sset to the logic circuit 115 according to two resultant signals VC1 and VC2. The logic circuit 115 generates the pulse control signal Ton with on-time pulse width to control the switching transistors HSFET & LSFET according to the logic control signal Sset. The start timing of the on-time pulse width is determined by the logic control signal Sset.

In practice, the error amplifier 1051 is used for amplifying the difference between output voltage signal Vout and reference voltage Vref to generate the output voltage ripple signal Vripple as the signal VC1. The signal VC1 is transmitted to the positive input of the comparator 110. The voltage ramp generator 1057 is used for generating the voltage ramp signal Vramp as the signal VC2 provided to the negative input of the comparator 110. The voltage ramp signal Vramp can be used for emulating the pure current ramp signal. The comparator 110 outputs a logic high level as its output (i.e. the logic control signal Sset) when the signal VC1 is higher than the signal VC2, and outputs a logic low level as its output when the signal VC1 is lower than the signal VC2. The generator 1151 receives the DC input voltage VIN and the reference voltage Vref to generate the pulse control signal Ton with the on-time pulse width according to the logic control signal Sset. The control logic 1153 controls the ON/OFF statuses of the switching transistors HSFET & LSFET according to the signal Ton. Further, the estimation circuit 1052 is configured for detecting the transient event to dynamically adjust the on-time pulse width of the pulse control signal Ton according to the amplified output voltage ripple signal Vripple (i.e. VC1). In addition, the detection of estimation circuit 1052 can be used for determining the start timing of the on-time pulse width of signal Ton.

Figure 2A:
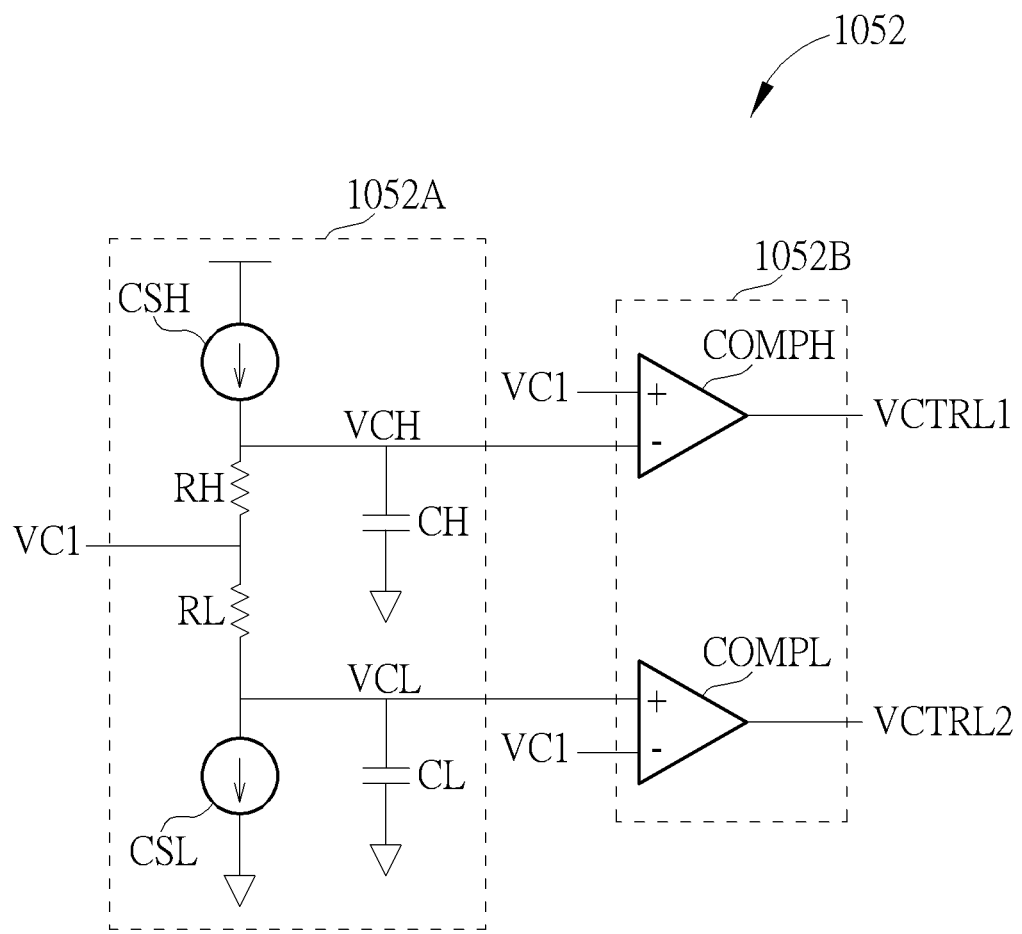
FIG. 2A is a diagram illustrating the estimation circuit as shown in FIG. 1 according to a first embodiment of the invention.
Figure 2B:
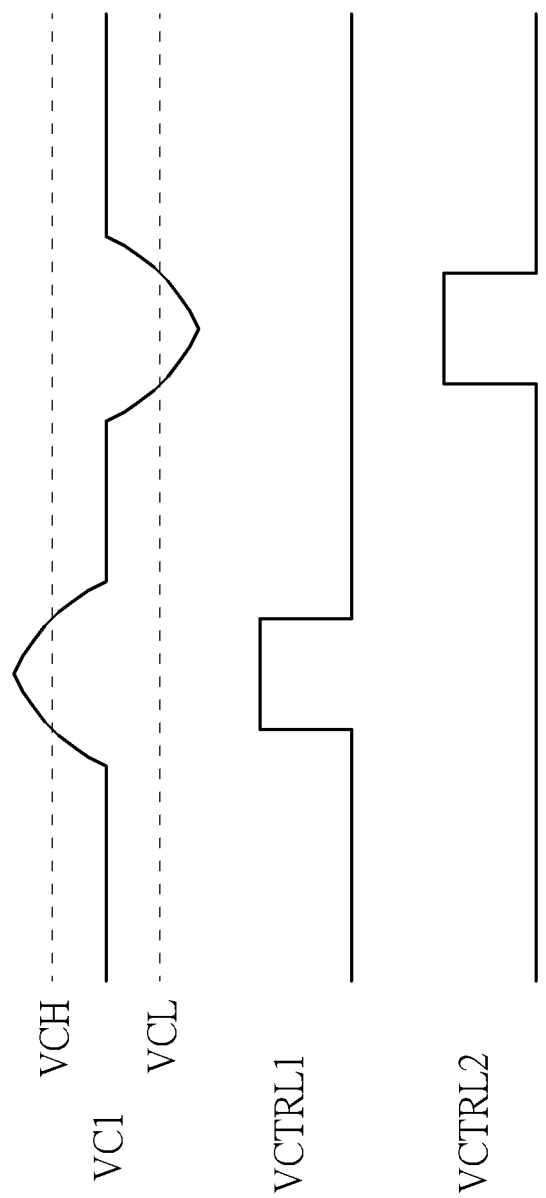
FIG. 2B is a diagram illustrating examples of signals VC, VCH, VCL, VCTRL1, and VCTRL2 as shown in FIG. 2A.

The estimation circuit 1052 can adopt a digital control scheme to dynamically adjust the on-time pulse width of the pulse control signal Ton according to the signal VC1. Please refer to FIG. 2A in conjunction with FIG. 2B. FIG. 2A is a diagram illustrating the estimation circuit 1052 as shown in FIG. 1 according to a first embodiment of the invention. FIG. 2B is a diagram illustrating examples of signals VC, VCH, VCL, VCTRL1, and VCTRL2 as shown in FIG. 2A. The estimation circuit 1052 comprises a threshold voltage generator 1052A and a comparator circuit 1052B. The threshold voltage generator 1052A comprises current sources CSH & CSL, resistors RH & RL, and capacitors CH & CL. The comparator circuit 1052B comprises comparators COMPH & COMPL. The threshold voltage generator 1052A employs the current source CSH, resistor RH, and capacitor CH to generate a high threshold voltage VCH shown in FIG. 2B, and the comparator circuit 1052B employs the comparator COMPH to compare the signal VC1 with high threshold voltage VCH to generate the signal VCTRL1. The signal VCTRL1 is at a high logic level when the signal VC1 is higher than the threshold VCH, and is at a low logic level when the signal VC1 is lower than the threshold VCH. The high threshold voltage VCH can be regarded as a slowly changed level. When a transient event of DC-to-DC buck converter 100 occurs, the output voltage ripple signal Vripple on the output voltage signal Vout is generated and amplified by the error amplifier 1052 and is used as the signal VC1 provided for the estimation circuit 1052. The signal VC1 will sharply change. As shown in FIG. 2B, the signal VC1 sharply changes and becomes higher than the threshold VCH, and the estimation circuit 1052 can detect the occurrence of this transient event by adopting the comparator COMPH to compare the signal VC1 with threshold VCH to generate the signal VCTRL1.

Similarly, the threshold voltage generator 1052A employs the current source CSL, resistor RL, and capacitor CL to generate a low threshold voltage VCL shown in FIG. 2B, and the comparator circuit 1052B employs the comparator COMPL to compare the signal VC1 with low threshold voltage VCL to generate the signal VCTRL2. The signal VCTRL2 is at a high logic level when the signal VC1 is lower than the threshold VCL, and is at a low logic level when the signal VC1 is higher than the threshold VCL. The low threshold voltage VCL can be also regarded as a slowly changed level. When a transient event of DC-to-DC buck converter 100 occurs, the signal VC1 will sharply change. As shown in FIG. 2B, the signal VC1 sharply changes and becomes lower than the threshold VCL, and the estimation circuit 1052 can detect the occurrence of this transient event by adopting the comparator COMPL to compare the signal VC1 with threshold VCL to generate the signal VCTRL2.

Based on the generated signals VCTRL1 and VCTRL2, the estimation circuit 1052 can include a fast transient response capability to detect transient event(s) and then adaptively extend or shorten the on-time pulse width of the pulse control signal Ton. In addition, the estimation circuit 1052 can refer to the generated signals VCTRL1 and VCTRL2 to decide the start timing of the on-time pulse width.

Figure 3A:
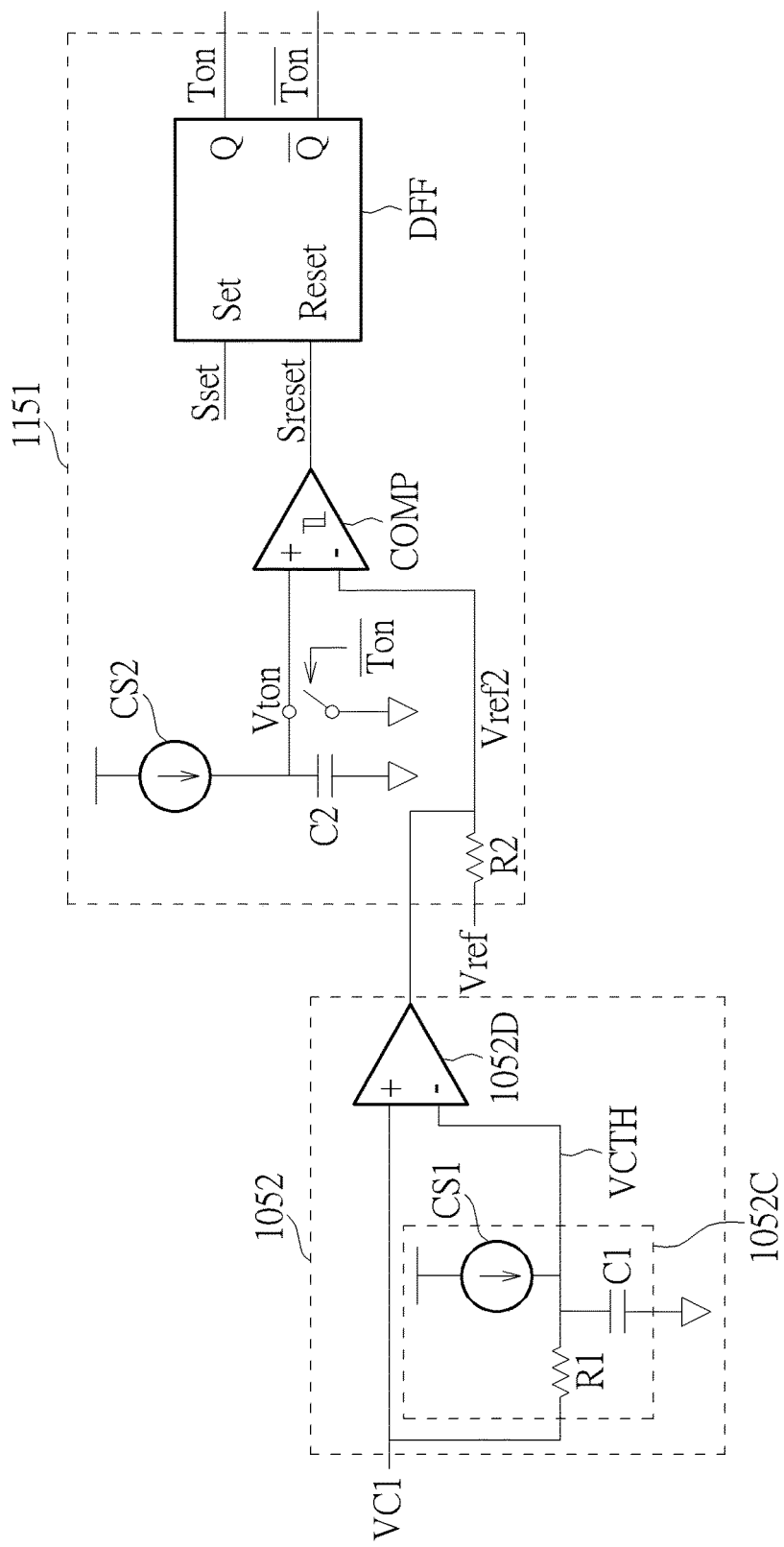
FIG. 3A is a diagram of the estimation circuit and generator as shown in FIG. 1 according to a second embodiment of the present invention.
Figure 3B:
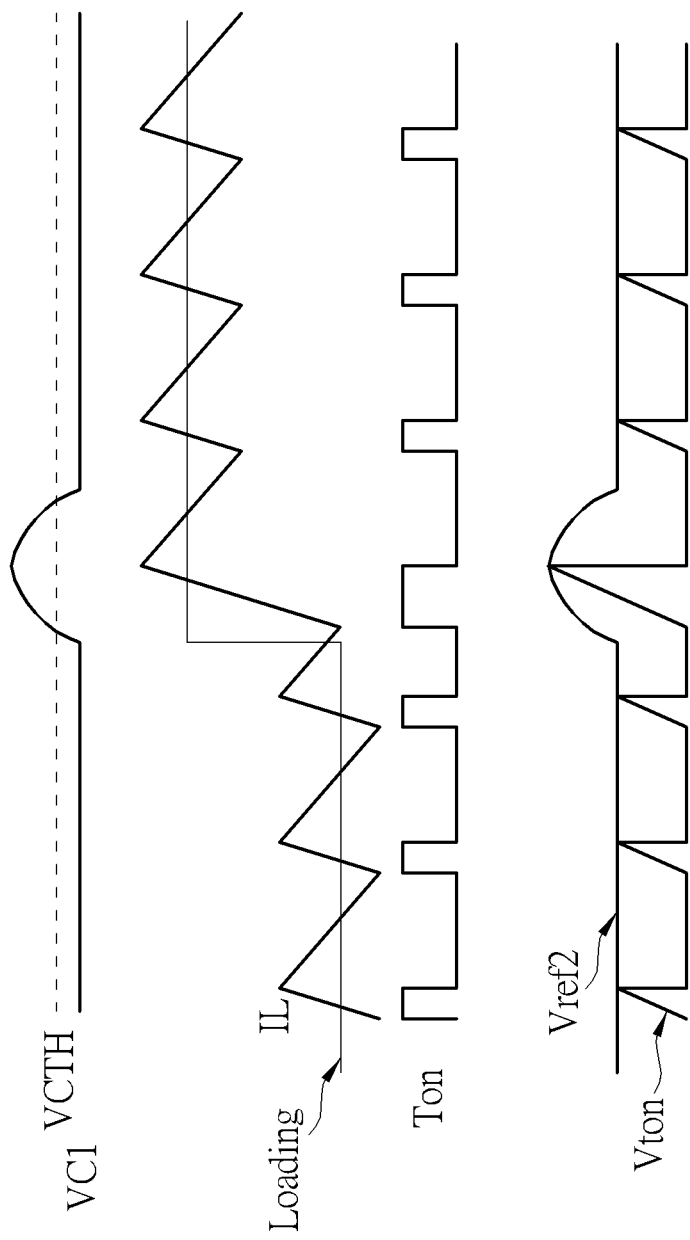
FIG. 3B is a diagram illustrating an example of the signals VC1, VCH, IL, Ton, and Vton as shown in FIG. 3A.

Additionally, the estimation circuit 1052 can adopt an analog control scheme to dynamically adjust the on-time pulse width of the pulse control signal Ton according to the signal VC1. Please refer to FIG. 3A in conjunction with FIG. 3B. FIG. 3A is a diagram illustrating the estimation circuit 1052 and generator 1151 according to a second embodiment of the present invention. FIG. 3B is a diagram illustrating an example of the signals VC1, VCH, IL, Ton, and Vton as shown in FIG. 3A. The estimation circuit 1052 comprises a threshold voltage generator 1052C and a transconductance amplifier 1052D, and the threshold voltage generator 1052C comprises the resistor R1, capacitor C1, and current source CS1. The generator 1151 comprises a current source CS2, capacitor C2, resistor R2, comparator COMP, and D-type flip flop DFF. The threshold voltage generator 1052C is configured for generating a specific threshold voltage VCTH for the amplified output voltage ripple signal VC1 provided for the negative input of transconductance amplifier 1052D by adopting resistor R1, capacitor C1, and current source CS1. The transconductance amplifier 1052D is configured for receiving the signals VC1 and threshold VCTH and referencing the signal VC1 and threshold VCTH, to produce the output current for the generator 1151 when the level of signal VC1 is higher than the threshold VCTH. The produced current is regarded as a source current flowing from the output of transconductance amplifier 1052D into the generator 1151. The generator 1151 receives the reference voltage Vref and input Dc voltage VIN, and the source current flows into the generator 1151 via the node between the resistor R2 and the negative input of comparator COMP so that the level Vref2 is raised to a higher level by the source current when the source current flows into the generator 1151. As shown in FIG. 3B, the on-time pulse width of pulse control signal Ton is constant or fixed whether the voltage converter 100 operates under a light loading or a heavy loading condition. When a transient event occurs due to that the loading varies, the level of signal VC1 becomes higher than the threshold VCTH. The estimation circuit 1052 can detect the occurrence of the transient event and identify that the loading of voltage converter 100 changes from the light loading condition to the heavy loading condition since the heavy loading will result in a voltage drop on the output voltage signal and the level of VC1 correspondingly reflects the voltage drop. The detection of estimation circuit 1052 for the level of VC1 and threshold VCTH can help to decide the start timing of the on-time pulse width. Further, the estimation circuit 1052 can adaptively extend the on-time pulse width to decide the end timing of the pulse width by providing the source current to the generator 1151 to make the voltage Vref2 become higher. When the voltage Vref2 becomes higher due to the source current, a longer time period is needed to make the level of Vton exceed above the level of Vref2 by using the current source CS2 to charge capacitor C2. Thus, the on-time pulse width of Ton is extended. When the level of Vton becomes higher than the level of Vref2, the comparator COMP generates a logic signal as the signal Sreset for the reset terminal of D-type flip flop DFF to decide the end timing of the on-time pulse width.

Figure 4A:
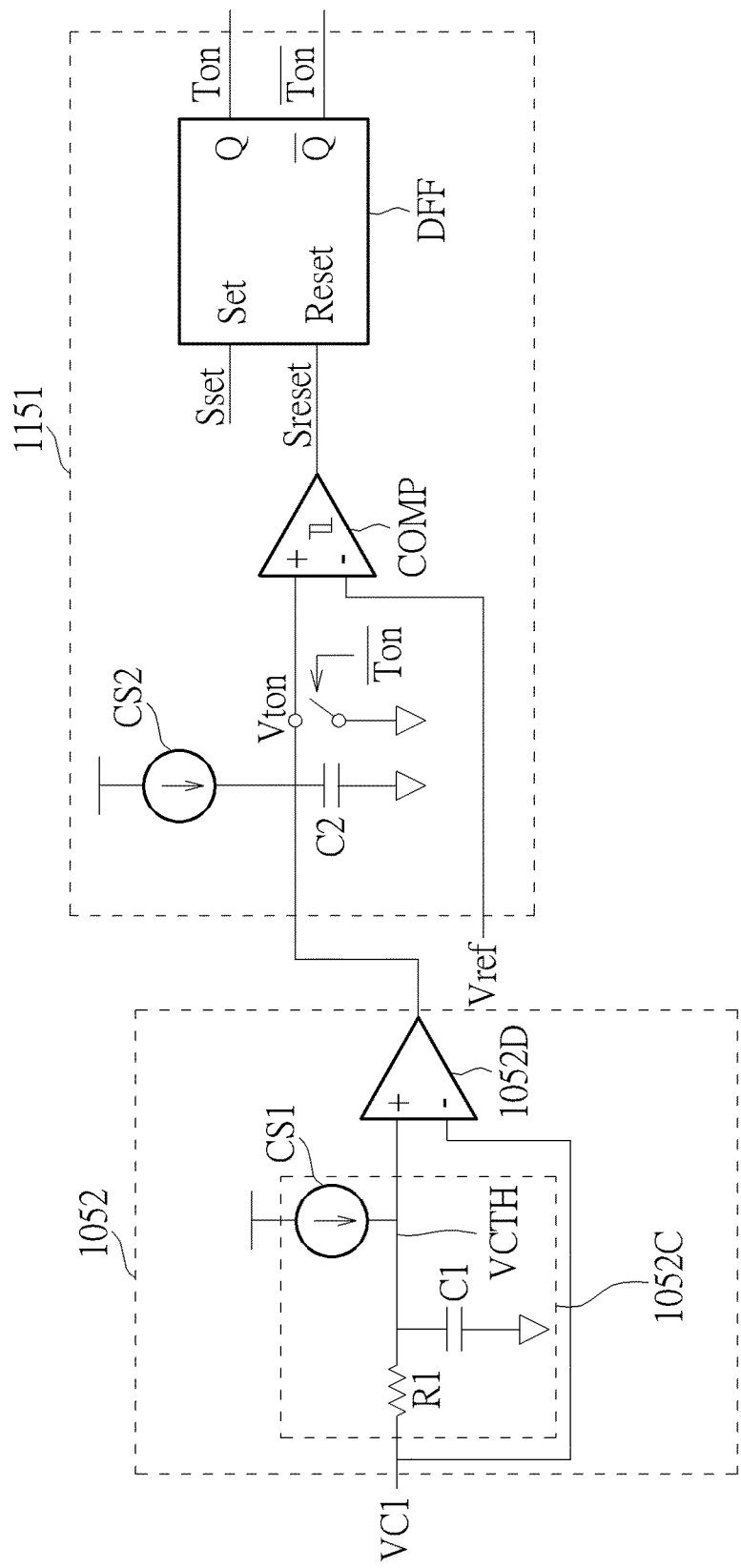
FIG. 4A is a diagram illustrating the estimation circuit and generator as shown in FIG. 1 according to a third embodiment of the present invention.
Figure 4B:
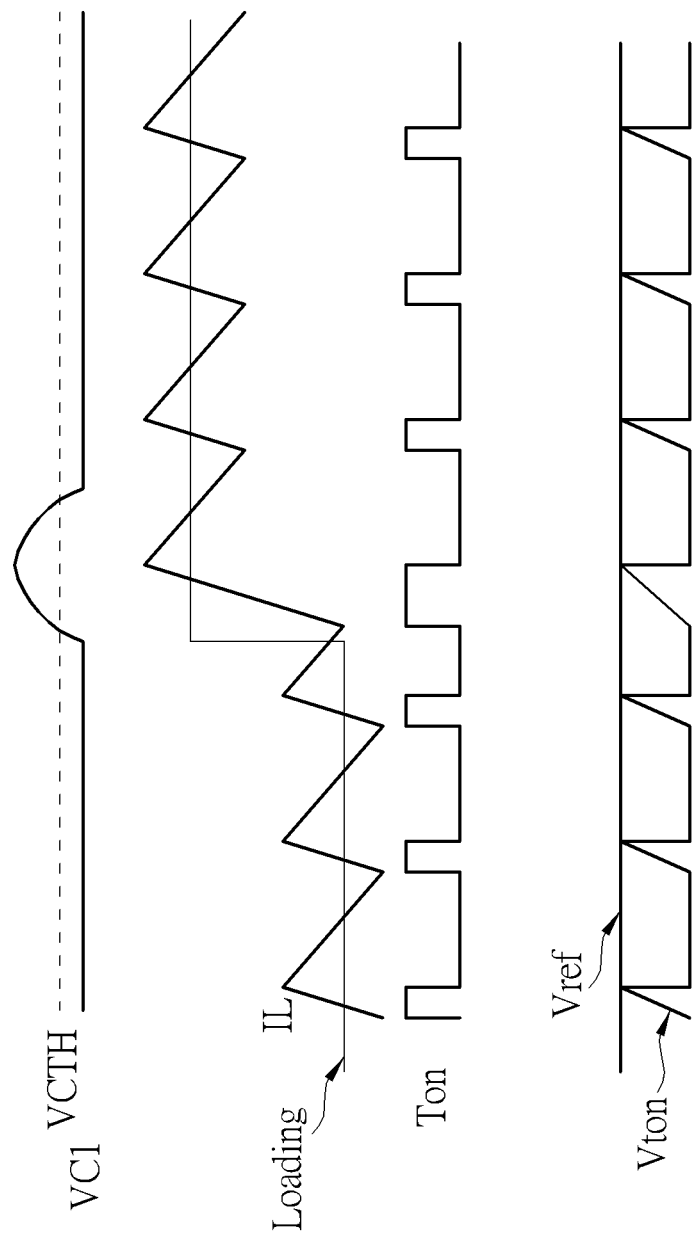
FIG. 4B is a diagram illustrating an example of the signals VC1, VCH, IL, Ton, and Vton as shown in FIG. 4A.

Additionally, in another embodiment, the estimation circuit 1052 can be arranged for using a sink current for the generator 1151 to adaptively adjusting the on-time pulse width of the signal Ton. FIG. 4A is a diagram illustrating the estimation circuit 1052 and generator 1151 according to a third embodiment of the present invention. FIG. 4B is a diagram illustrating an example of the signals VC1, VCH, IL, Ton, and Vton as shown in FIG. 4A. The estimation circuit 1052 comprises the threshold voltage generator 1052C and the transconductance amplifier 1052D, and the threshold voltage generator 1052C comprises the resistor R1, capacitor C1, and current source CS1. The generator 1151 comprises the current source CS2, capacitor C2, resistor R2, comparator COMP, and D-type flip flop DFF. A difference compared to the embodiment of FIG. 3A, in FIG. 4A, the threshold voltage generator 1052C is configured for generating the specific threshold voltage VCTH for the amplified output voltage ripple signal VC1 and providing the voltage VCTH to the positive input of transconductance amplifier 1052D by adopting resistor R1, capacitor C1, and current source CS1. The transconductance amplifier 1052D receives the signals VC1 at its negative input and receives the threshold VCTH at its positive input. The transconductance amplifier 1052D refers to the difference between signal VC1 and threshold VCTH to produce a sink current for the generator 1151 when the level of signal VC1 is higher than the threshold VCTH. The produced sink current flows from the generator 1151 back to the transconductance amplifier 1052D. The generator 1151 receives the reference voltage Vref and input Dc voltage VIN, and the sink current outflows from the generator 1151 via the positive input terminal of comparator COMP so that the level of signal Vton is gradually and slowly raised when the sink current is produced. As shown in FIG. 4B, the on-time pulse width of pulse control signal Ton is constant or fixed whether the voltage converter 100 operates under a light loading or a heavy loading condition. When a transient event occurs due to that the loading varies, the level of signal VC1 becomes higher than the threshold VCTH. The estimation circuit 1052 can detect the occurrence of the transient event and identify that the loading of voltage converter 100 changes from the light loading condition to the heavy loading condition. The detection of estimation circuit 1052 for the level of VC1 and threshold VCTH can help to decide the start timing of the on-time pulse width. Further, the estimation circuit 1052 can adaptively extend the on-time pulse width to decide the end timing of the pulse width by using the sink current to make the voltage Vton become slowly raised. When the sink current is generated, a longer time period is needed to make the level of Vton exceed above the level of Vref by using the current source CS2 to charge capacitor C2 since only a part of current provided from the current source CS2 is used for charging the capacitor C2 due to the sink current. Thus, the on-time pulse width of Ton is extended. In FIG. 4B, compared to normal conditions without transient events, the slope for the level of signal Vton is smaller when the transient event occurs. When the level of Vton becomes higher than the level of Vref, the comparator COMP generates a logic signal as the signal Sreset for the reset terminal of D-type flip flop DFF to decide the end timing of the on-time pulse width.

Figure 5:
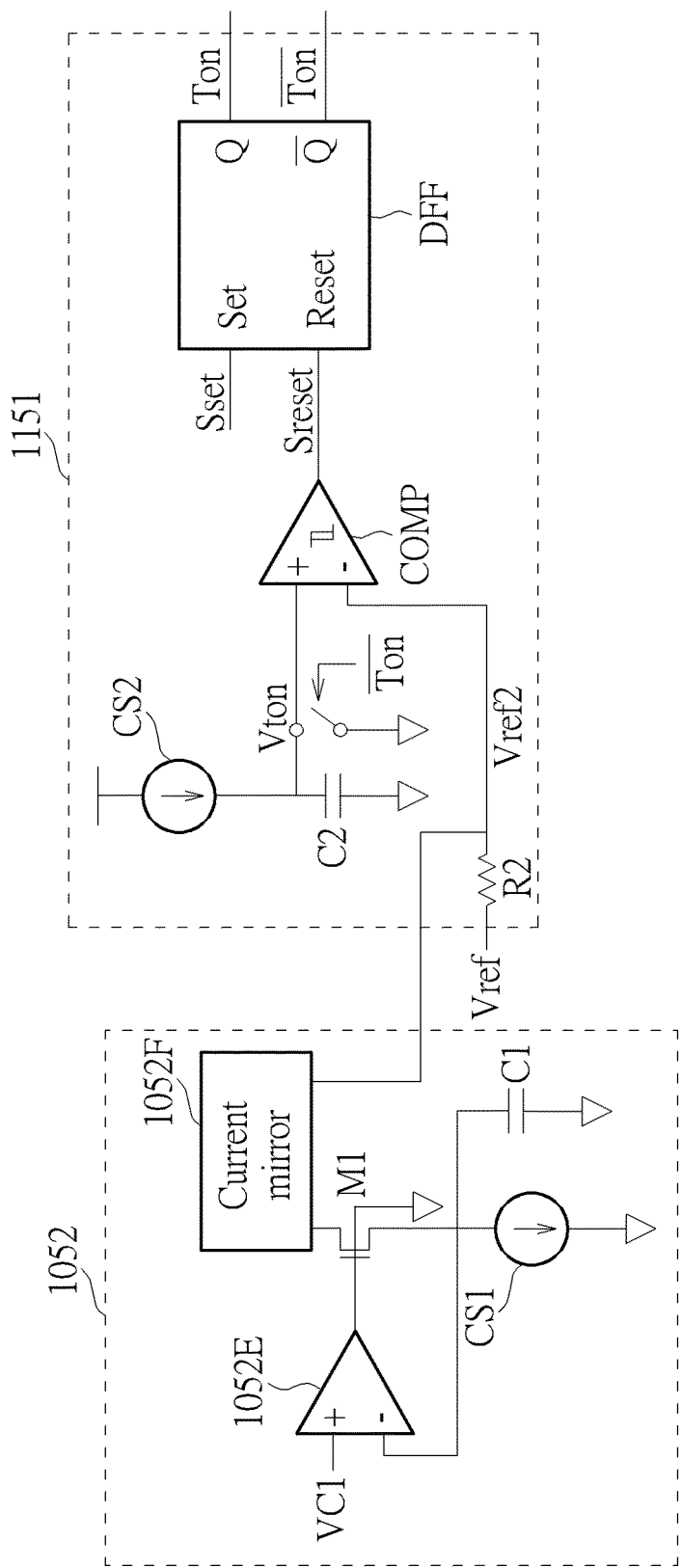
FIG. 5 is a diagram showing the circuit elements of estimation circuit and generator as shown in FIG. 1 according to a fourth embodiment of the present invention.

Additionally, in other embodiments, the operation of generating a source current for the generator 1151 can be implemented by a current mirror circuitry structure. FIG. 5 is a diagram showing the circuit elements of estimation circuit 1052 and generator 1151 as shown in FIG. 1 according to a fourth embodiment of the present invention. As shown in FIG. 5, the estimation circuit 1052 comprises an operational amplifier 1052E, a transistor M1, a current source CS1, a capacitor C1, and a current mirror 1052F. The generator 1151 comprises elements similar those shown in FIG. 3A. The positive input of operational amplifier 1052E is coupled to the output voltage signal, and its negative input is coupled to between the current source CS1 and the capacitor C1. The voltage level across the capacitor C1 is equivalent at the DC level of output voltage signal VC1. The operational amplifier 1052E is arranged to turn on the transistor M1 when detecting transient event according to the signal VC1 (i.e. output voltage ripple signal). The current mirror 1052F then mirrors a source current and provides this source current to the generator 1151 once the transistor M1 is turned on for dynamically extending the on-time pulse width of the pulse control signal Ton. The operation of generator 1151 is similar to that of generator 1151 shown in FIG. 3A, and is not detailed for brevity. Further, the estimation circuit 1052 in FIG. 5 can be also used for providing the source current for the generator 1151 shown in FIG. 4A to adaptively shorten the on-time pulse width of the pulse control signal Ton; this modification also obeys the spirit of the invention.

Figure 6:
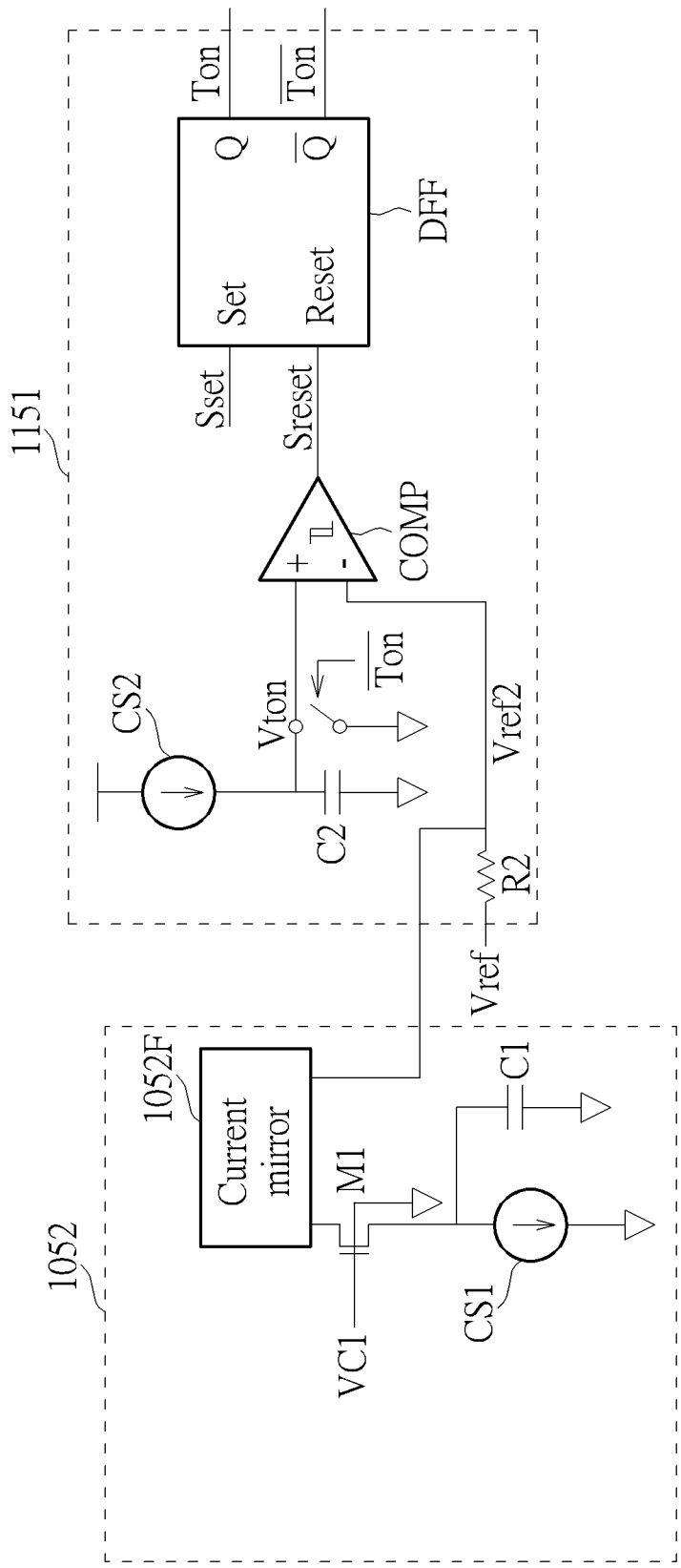
FIG. 6 is a diagram showing the circuit elements of estimation circuit and generator as shown in FIG. 1 according to a fifth embodiment of the present invention.

The operation of generating a source current for the generator 1151 can be implemented by a different current mirror circuitry structure. FIG. 6 is a diagram showing the circuit elements of estimation circuit 1052 and generator 1151 as shown in FIG. 1 according to a fifth embodiment of the present invention. As shown in FIG. 6, the estimation circuit 1052 comprises the transistor M1, current source CS1, capacitor C1, and current mirror 1052F. The generator 1151 comprises elements similar those shown in FIG. 3A. The capacitor C1 and current source CS1 are connected in parallel. The transistor M1 is coupled between the current mirror 1052F and the current source CS1. The signal VC1 is coupled to the gate of transistor M1, and the transistor M1 can be used for detecting the occurrence of a transient event according to the signal VC1 (i.e. output voltage ripple signal). The current mirror 1052F then mirrors a source current and provides this source current to the generator 1151 for dynamically extending the on-time pulse width of the pulse control signal Ton. The operation of generator 1151 is similar to that of generator 1151 shown in FIG. 3A, and is not detailed for brevity. Further, the estimation circuit 1052 in FIG. 6 can be also used for providing the source current for the generator 1151 shown in FIG. 4A to adaptively shorten the on-time pulse width of the pulse control signal Ton; this modification also obeys the spirit of the invention.

Figure 7A:
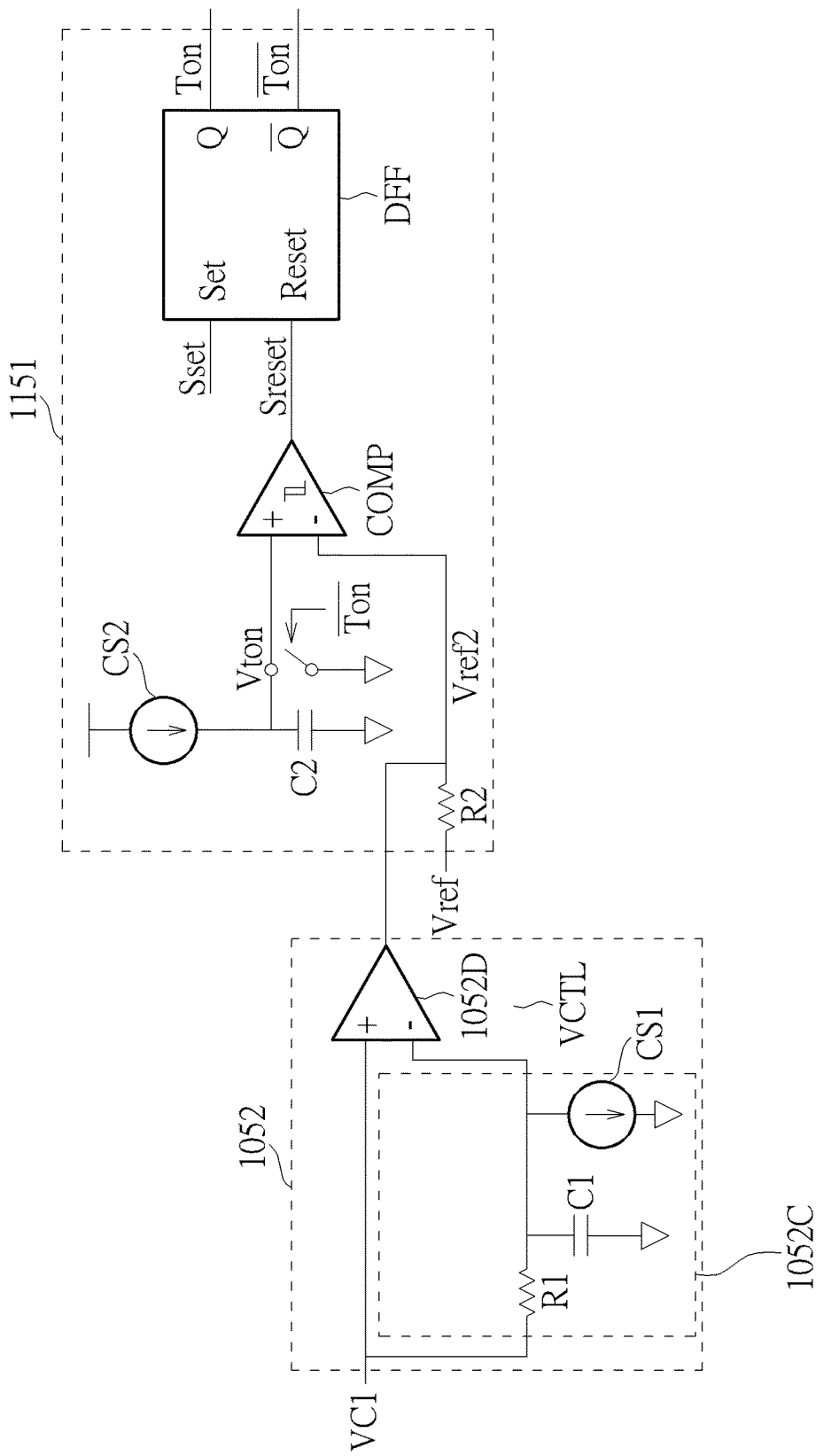
FIG. 7A is a diagram illustrating the estimation circuit and generator as shown in FIG. 1 according to a sixth embodiment of the present invention.
Figure 7B:
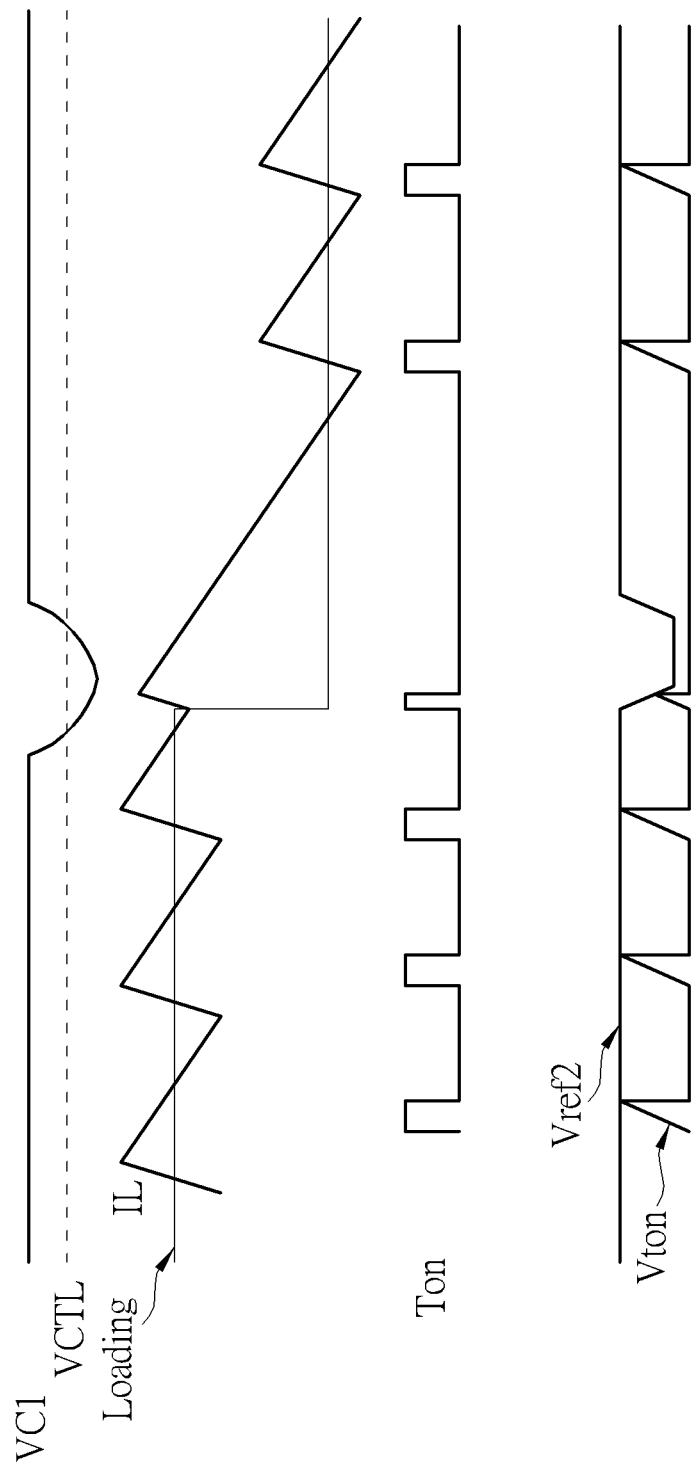
FIG. 7B is a diagram illustrating an example of the signals VC1, VCL, IL, Ton, and Vton as shown in FIG. 7A.

Further, in other embodiments, a different threshold voltage level VCTL can be generated and used by the estimation circuit 1052 to decide the occurrence of a transient event and adaptively adjust the on-time pulse width of pulse control signal Ton. Please refer to FIG. 7A in conjunction with FIG. 7B. FIG. 7A is a diagram illustrating the estimation circuit 1052 and generator 1151 according to a sixth embodiment of the present invention. FIG. 7B is a diagram illustrating an example of the signals VC1, VCL, IL, Ton, and Vton as shown in FIG. 7A. The estimation circuit 1052 comprises a threshold voltage generator 1052G and a transconductance amplifier 1052D, and the threshold voltage generator 1052G comprises the resistor R1, capacitor C1, and current source CS1. The operation of generator 1151 in FIG. 7A is similar to that mentioned in FIG. 3A and is not detailed for brevity.

The capacitor C1 and current source CS1 are connected in parallel, and are connected to the negative input of transconductance amplifier 1052D. The resistor R1 is coupled between the signal VC1 and the negative input of transconductance amplifier 1052D. The signal VC1 is transmitted to the positive input of transconductance amplifier 1052D, and is transmitted to its negative input through the resistor R1. The threshold voltage generator 1052G is configured for generating the specific threshold voltage VCTL provided for transconductance amplifier 1052D by adopting resistor R1, capacitor C1, and current source CS1. The transconductance amplifier 1052D is configured for receiving the signals VC1 and threshold VCTL and referencing the signal VC1 and threshold VCTL to produce a sink current for the generator 1151 when the level of signal VC1 is lower than the threshold VCTL. The produced sink current flows from the node between resistor R2 and negative input of comparator COMP within the generator 1151.

As shown by FIG. 7B, the on-time pulse width of pulse control signal Ton is constant or fixed whether the voltage converter 100 operates under the light loading or the heavy loading condition. When a transient event occurs due to that the loading varies, the level of signal VC1 becomes lower than the threshold VCTL. The estimation circuit 1052 can detect the occurrence of the transient event and identify that the loading of voltage converter 100 changes from the heavy loading condition to the light loading condition since the loading variation will result in a voltage change on the output voltage signal Vout and the level of VC1 correspondingly reflects the voltage change. The detection of estimation circuit 1052 for the level of VC1 and threshold VCTL can help to decide the start timing of the on-time pulse width. Further, the estimation circuit 1052 can adaptively shorten the on-time pulse width to decide the end timing of the pulse width by using the sink current to make the voltage Vref2 become lower. When the voltage Vref2 becomes lower due to the sink current, only a shorter time period is needed to make the level of Vton exceed above the level of Vref2 by using the current source CS2 to charge capacitor C2. Thus, the on-time pulse width of Ton is shortened. When the level of Vton becomes higher than the level of Vref2, the comparator COMP generates a logic signal as the signal Sreset for the reset terminal of D-type flip flop DFF to decide the end timing of the on-time pulse width.

Figure 8A:
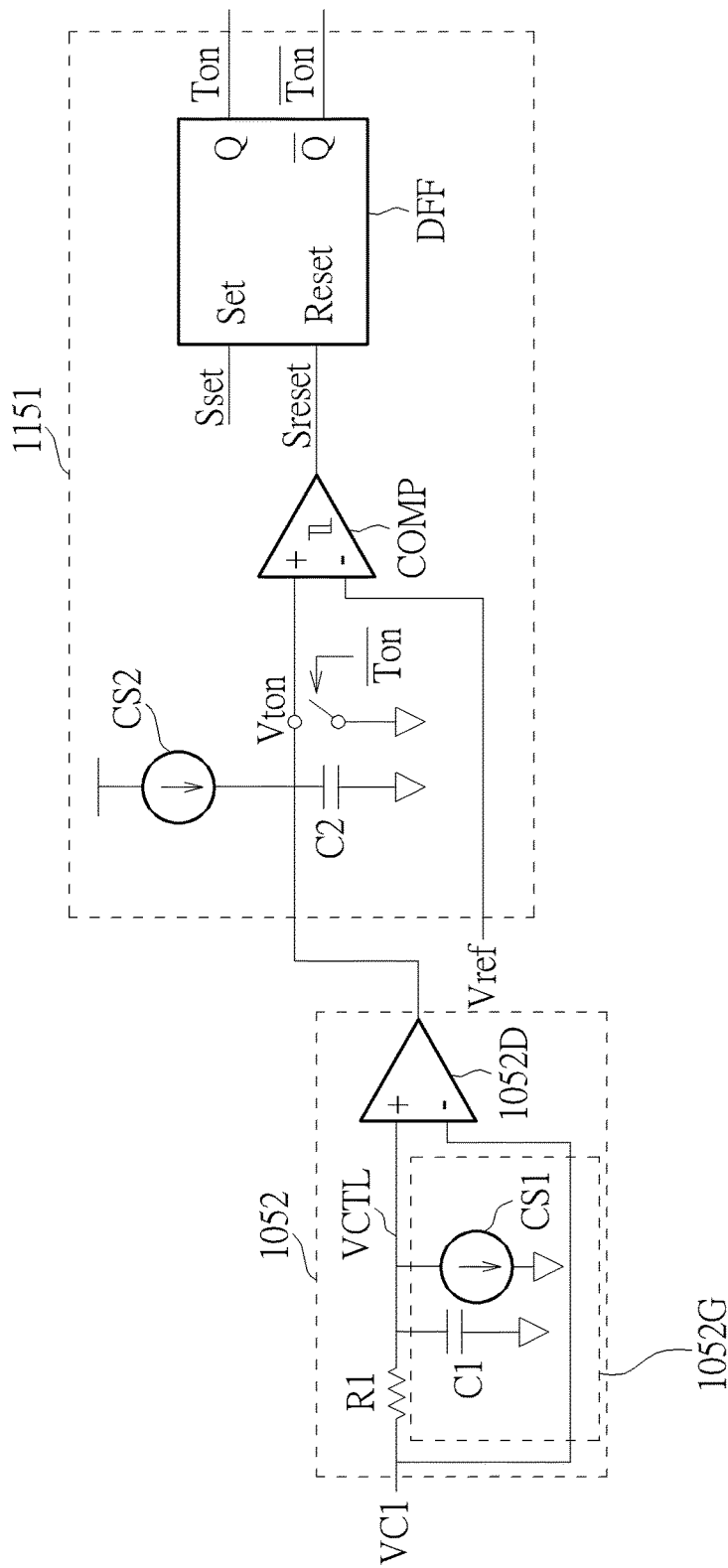
FIG. 8A is a diagram illustrating the estimation circuit and generator as shown in FIG. 1 according to a seventh embodiment of the present invention.
Figure 8B:
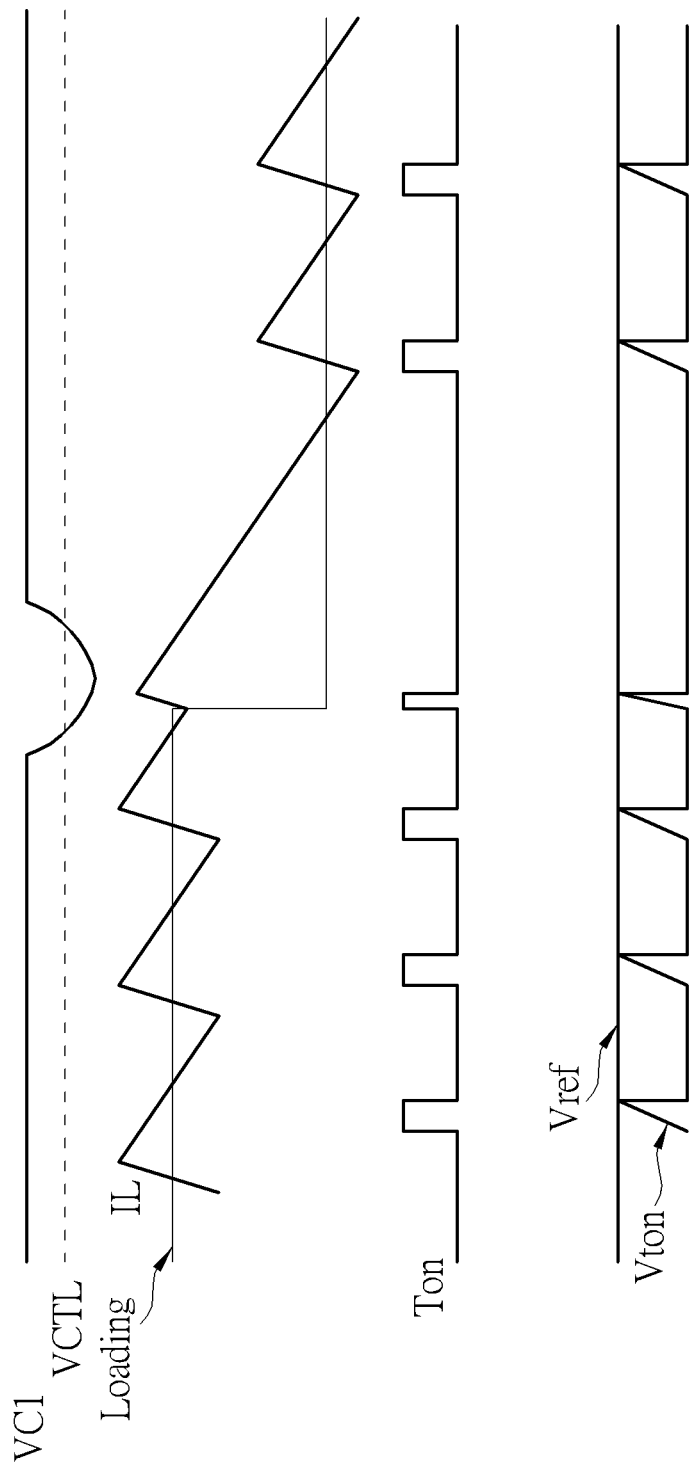
FIG. 8B is a diagram illustrating an example of the signals VC1, VCTL, IL, Ton, and Vton as shown in FIG. 8A.

Additionally, in another embodiment, the different threshold voltage level VCTL can be generated and used by the estimation circuit 1052 to decide the occurrence of a transient event and adaptively adjust the on-time pulse width of pulse control signal Ton by using a source current. FIG. 8A is a diagram illustrating the estimation circuit 1052 and generator 1151 according to a seventh embodiment of the present invention. FIG. 8B is a diagram illustrating an example of the signals VC1, VCTL, IL, Ton, and Vton as shown in FIG. 8A. The estimation circuit 1052 comprises the threshold voltage generator 1052G and the transconductance amplifier 1052D, and the threshold voltage generator 1052G comprises the resistor R1, capacitor C1, and current source CS1. The capacitor C1 and current source CS1 are connected in parallel, and are connected to the positive input of transconductance amplifier 1052D. The resistor R1 is coupled between the signal VC1 and the positive input of transconductance amplifier 1052D. The signal VC1 is transmitted to the negative input of transconductance amplifier 1052D, and is transmitted to its positive input through the resistor R1. The threshold voltage generator 1052G is configured for generating the specific threshold voltage VCTL for the amplified output voltage ripple signal VC1 and providing the voltage VCTL to the positive input of transconductance amplifier 1052D by adopting resistor R1, capacitor C1, and current source CS1. The transconductance amplifier 1052D is arranged for receiving the signals VC1 at its negative input and receiving the threshold VCTL at its positive input to refer to the difference between signal VC1 and threshold VCTL to produce a source current providing for the generator 1151 when the level of signal VC1 is lower than the threshold VCTL. The produced source current flows from transconductance amplifier 1052D to the generator 1151. The operation of generator 1151 in FIG. 8A is similar to that mentioned in FIG. 4A and is not detailed for brevity.

As shown in FIG. 8B, the on-time pulse width of pulse control signal Ton is constant or fixed whether the voltage converter 100 operates under the light loading or the heavy loading condition. When a transient event occurs due to that the loading varies, the level of signal VC1 becomes lower than the threshold VCTL. The estimation circuit 1052 can detect the occurrence of the transient event and identify that the loading of voltage converter 100 changes from the heavy loading condition to the light loading condition. The detection of estimation circuit 1052 for the level of VC1 and threshold VCTL can help to decide the start timing of the on-time pulse width. Further, the estimation circuit 1052 can adaptively shorten the on-time pulse width to decide the end timing of the pulse width by using the source current to make the voltage Vton become more rapidly raised. When the source current is generated, only a shorter time period is needed to make the level of Vton exceed above the level of Vref by using the current source CS2 to charge capacitor C2 since more current are provided for charging the capacitor C2 due to the source current. Thus, the on-time pulse width of Ton is shortened. In FIG. 8B, compared to normal conditions without transient events, the slope for the level of signal Vton is larger when the transient event occurs. When the level of Vton becomes lower than the level of Vref, the comparator COMP generates a logic signal as the signal Sreset for the reset terminal of D-type flip flop DFF to decide the end timing of the on-time pulse width.

Further, it should be noted that the above-mentioned digital and analog control schemes adopted by the estimation circuit 1052 can be combined together by using a current mirror circuitry structure. This modification also falls within the scope of the invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A constant on-time pulse width control-based apparatus capable of detecting a transient event of a voltage converter, comprising:
   a specific comparator configured for generating a logic control signal to a logic circuit according to two resultant signals of a controller;
   the logic circuit, coupled to the specific comparator, configured for generating a pulse control signal with an on-time pulse width to charge an output capacitor of an output stage circuit of the voltage converter according to the logic control signal; and
   the controller, coupled to the specific comparator and the logic circuit, configured for generating the two resultant signals to the specific comparator by generating a voltage ramp signal and amplifying an output voltage ripple signal based on a reference voltage, and configured for detecting the transient event and adaptively adjusting the on-time pulse width of the pulse control signal according to the amplified output voltage ripple signal;
   wherein the controller comprises:
   an error amplifier, coupled to an input of the specific comparator, configured for receiving the reference voltage and an output voltage signal to generate and amplify the output voltage ripple signal; and
   an estimation circuit, coupled to the error amplifier, for detecting the transient event to adaptively adjust the on-time pulse width of the pulse control signal according to the amplified output voltage ripple signal.

2. The apparatus of claim 1, wherein the estimation circuit comprises:
   a threshold voltage generator, configured for generating a specific threshold voltage for the amplified output voltage ripple signal; and
   a comparator circuit, coupled to the threshold voltage generator, configured for comparing the amplified output voltage ripple signal with the specific threshold voltage to generate a control signal to adaptively adjust the on-time pulse width of the pulse control signal.

3. The apparatus of claim 2, wherein the threshold voltage generator comprises:
   a current source, coupled to a reference level;
   a resistor, coupled between the current source and the amplified output voltage ripple signal; and
   a capacitor, having a first end coupled to a ground level and a second end coupled to a node between the current source and the resistor and connected to an input of the first comparator;
   wherein the specific threshold voltage is generated at the second end of the capacitor according to the current source and the resistor.

4. The apparatus of claim 3, wherein the estimation circuit determines that the transient event occurs when the amplified output voltage ripple signal is higher than the specific threshold voltage if the specific threshold voltage is a high threshold voltage, or determines that the transient event occurs when the amplified output voltage ripple signal is lower than the specific threshold voltage if the specific threshold voltage is a low threshold voltage.

5. The apparatus of claim 1, wherein the estimation circuit comprises:
   a threshold voltage generator, configured for generating a specific threshold voltage for the amplified output voltage ripple signal; and
   a transconductance amplifier, coupled to the threshold voltage generator, configured for converting a voltage difference between the specific threshold voltage and the amplified output voltage ripple signal to generate a current signal for using the current signal as a source current or as a sink current for the logic circuit to dynamically extend or shorten the on-time pulse width of the pulse control signal when the transient event is detected.

6. The apparatus of claim 1, wherein the estimation circuit comprises:
   a current source;
   a transistor, having a control terminal coupled to the amplified output voltage ripple signal, a first terminal coupled to the current source, and a second terminal coupled to a current mirror; and
   the current mirror, coupled to the transistor, for mirroring a current as a source current for the logic circuit to dynamically extend or shorten the on-time pulse width of the pulse control signal when the transient event is detected.

7. The apparatus of claim 6, wherein the estimation circuit further comprises:
an operational amplifier, having a positive input for receiving the amplified output voltage ripple signal, a negative input coupled to the first terminal of the current source, and an output coupled to the control terminal of the transistor.

8. A constant on-time pulse width control-based method capable of detecting a transient event of a voltage converter, comprising:
using a specific comparator to generate a logic control signal to a logic circuit according to two resultant signals;
generating a pulse control signal with an on-time pulse width to charge an output capacitor of the voltage converter according to the logic control signal;
generating the two resultant signals to the specific comparator by generating a voltage ramp signal and amplifying an output voltage ripple signal based on a reference voltage; and
detecting the transient event and adaptively adjusting the on-time pulse width of the pulse control signal according to the amplified output voltage ripple signal;
wherein the step of detecting the transient event and adaptively adjusting the on-time pulse width of the pulse control signal according to the amplified output voltage ripple signal comprises:
generating a specific threshold voltage for the amplified output voltage ripple signal; and
comparing the amplified output voltage ripple signal with the specific threshold voltage to generate a control signal to adaptively adjust the on-time pulse width of the pulse control signal.

\* \* \* \* \*